(12) United States Patent
Rainish et al.

(10) Patent No.: US 10,348,449 B2
(45) Date of Patent: *Jul. 9, 2019

(54) BROADCASTING OF DIGITAL VIDEO TO MOBILE TERMINALS

(71) Applicant: AT&T INTELLECTUAL PROPERTY I, L.P., Atlanta, GA (US)

(72) Inventors: Doron Rainish, Ramat-Gan (IL); Ilan Saul Barak, Kfar-Saba (IL); Raz Shani, Raanana (IL)

(73) Assignee: AT&T INTELLECTUAL PROPERTY I, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/723,389

(22) Filed: Oct. 3, 2017

(65) Prior Publication Data

US 2018/0026745 A1  Jan. 25, 2018

Related U.S. Application Data

(63) Continuation of application No. 13/452,945, filed on Apr. 23, 2012, now Pat. No. 9,819,443, which is a
(Continued)

(51) Int. Cl.
*H04L 1/18* (2006.01)
*H04L 1/00* (2006.01)
(Continued)

(52) U.S. Cl.
CPC ...... *H04L 1/0041* (2013.01); *H03M 13/2707* (2013.01); *H03M 13/2732* (2013.01);
(Continued)

(58) Field of Classification Search
None
See application file for complete search history.

(56) References Cited

U.S. PATENT DOCUMENTS

| 5,241,563 A | 8/1993 | Paik et al. |
| 5,600,672 A | 2/1997 | Oshima et al. |

(Continued)

FOREIGN PATENT DOCUMENTS

| EP | 1211839 A2 | 6/2002 |
| EP | 1826937 A1 | 8/2007 |
| WO | 03050992 A1 | 6/2003 |

OTHER PUBLICATIONS

European Patent Office—Extended European Search Report, European Patent Application No. 09157891.4, dated Jul. 30, 2009, Raysat Broadcasting Corporation, 12 pages.
(Continued)

*Primary Examiner* — Mujtaba M Chaudry
(74) *Attorney, Agent, or Firm* — Toler Law Group, PC

(57) ABSTRACT

A method includes processing error correction encoded data by a first processing chain of a transmitter. The processing includes interleaving a first portion of the error correction encoded data with respect to a first interleaving period to generate a first output signal. Interleaving the first portion includes de-multiplexing the first portion among multiple branches having respective delays in accordance with a distribution order and re-multiplexing delayed data from the branches to form the first output signal. The method includes processing the error correction encoded data by a second processing chain of the transmitter without use of interleaving to generate a second output signal. The method includes multiplexing the first output signal and the second output signal into a multiplexed stream. The method also includes transmitting the multiplexed stream from the transmitter over a communication channel to a receiver.

20 Claims, 10 Drawing Sheets

Related U.S. Application Data continuation of application No. 11/944,823, filed on Nov. 26, 2007, now Pat. No. 8,185,785.

(60) Provisional application No. 60/861,593, filed on Nov. 28, 2006.

(51) Int. Cl.

| | | |
|---|---|---|
| *H03M 13/27* | (2006.01) | |
| *H03M 13/00* | (2006.01) | |
| *H04N 19/89* | (2014.01) | |
| *H03M 13/11* | (2006.01) | |
| *H03M 13/15* | (2006.01) | |
| *H03M 13/29* | (2006.01) | |

(52) U.S. Cl.
CPC ... *H03M 13/2742* (2013.01); *H03M 13/6306* (2013.01); *H03M 13/6356* (2013.01); *H03M 13/6362* (2013.01); *H04L 1/007* (2013.01); *H04L 1/0045* (2013.01); *H04L 1/0071* (2013.01); *H04N 19/89* (2014.11); *H03M 13/1102* (2013.01); *H03M 13/1515* (2013.01); *H03M 13/29* (2013.01); *H03M 13/2957* (2013.01); *H04L 2001/0093* (2013.01)

(56) References Cited

U.S. PATENT DOCUMENTS

| | | | | |
|---|---|---|---|---|
| 5,946,357 | A * | 8/1999 | Sandin | H04L 1/0071 375/262 |
| 6,000,054 | A | 12/1999 | Bahr et al. | |
| 6,055,277 | A * | 4/2000 | Stephens | H03M 13/2742 370/535 |
| 6,128,330 | A * | 10/2000 | Schilling | H04B 1/7115 375/141 |
| 6,373,831 | B1 * | 4/2002 | Secord | H04L 1/0041 370/335 |
| 6,694,137 | B2 | 2/2004 | Sharon | |
| 6,807,222 | B1 | 10/2004 | Widdowson | |
| 7,278,081 | B1 | 10/2007 | Blair et al. | |
| 8,185,785 | B2 | 5/2012 | Ranish et al. | |
| 2002/0157058 | A1 | 10/2002 | Airel et al. | |
| 2002/0166093 | A1 * | 11/2002 | Eroz | H03M 13/036 714/755 |
| 2003/0189956 | A1 | 10/2003 | Tong et al. | |
| 2003/0214449 | A1 | 11/2003 | King | |
| 2003/0222778 | A1 | 12/2003 | Piesinger | |
| 2004/0101274 | A1 * | 5/2004 | Foisy | H03M 13/3761 386/201 |
| 2004/0170232 | A1 * | 9/2004 | Ha | H03M 13/271 375/295 |
| 2005/0089086 | A1 | 4/2005 | Hwang et al. | |
| 2005/0113040 | A1 | 5/2005 | Walker et al. | |
| 2005/0172202 | A1 * | 8/2005 | Eroz | H03M 13/2957 714/755 |
| 2007/0195815 | A1 | 8/2007 | Turner et al. | |
| 2007/0300127 | A1 * | 12/2007 | Watson | H03M 13/03 714/758 |
| 2008/0077410 | A1 | 4/2008 | Ojala et al. | |
| 2008/0091986 | A1 * | 4/2008 | Nimbalker | H03M 13/275 714/701 |
| 2008/0098284 | A1 | 4/2008 | Wolfgang et al. | |
| 2009/0016432 | A1 * | 1/2009 | Limberg | H04N 21/2383 375/240.01 |
| 2009/0061760 | A1 | 3/2009 | Barak et al. | |
| 2009/0074103 | A1 | 3/2009 | Varadarajan et al. | |

OTHER PUBLICATIONS

European Patent Office—Extended European Search Report, European Patent Application No. 07121667.5 [1928116], dated Jul. 4, 2008, Raysat, Inc., 8 pages.

European Patent Office—Extended European Search Report, European Patent Application No. 09156936.8 [2101432], dated Jul. 11, 2012,—At&T Intellectual Property, L.P., 8 pages.

"Framing Structure, Channel Coding and Modulation for Satellite Services to Handheld Devices (SH) below 3 GHz", Digital Video Broadcasting: DBV Document A111 (Revision 1), Jul. 2007, pp. 1-62.

Non-Final Office Action, U.S. Appl. No. 11/374,049, dated Aug. 7, 2009, 18 pages.

Non-Final Office Action, U.S. Appl. No. 11/944,823, dated Oct. 3, 2011, 19 pages.

Non-Final Office Action, U.S. Appl. No. 12/418,622, dated Dec. 8, 2010, 36 pages.

Eberlein, et al., "Comparison of Physical Layer Interleaving to Upper Layer Interleaving", Proceedings of the Seventh Workshop on Digital Broadcasting (Erlangen, Germany), Sep. 14-15, 2006, 8 pages.

Eberlein, et al., "Double Use of the Link Margin—Advanced Physical Layer for Satellite Broadcast to Mobile Users", Proceedings of the 2005 Joint Conference (11th Ka and Broadband Communications Conference and 23rd International Communications Satellite Systems Conference) (Rome, Italy), Sep. 25-28, 2005, pp. 1-8.

Ernst, et al., "Transport Layer Coding for the Land Mobile Satellite Channel", Proceedings of the 2004 59th IEEE Vehicular Technology Conference (VTC-2004) (Milan, Italy), May 17-19, 2004, pp. 2916-2920.

Heuberger, et al., "Digital Broadcasting to Mobile Users in the 12 GHz-Band", Proceedings of the Anniversary Symposium 20 Years Fraunhofer IIS-Microelectronics Applications for Information and Communication Technology (Erlagen, Germany), Jul. 1, 2005, pp. 40-41.

Kraus, et al., "Antennas", Antennas, Second Edition, Tata McGraw Hill Publishing Company, Limited (India), 1997, pp. 70-73.

Lou, et al., "FEC Scheme for a TDM-OFDM Based Satellite Radio. Broadcasting System", IEEE Transactions on Broadcasting, IEEE Service Center, Mar. 2000, pp. 60-67.

Papke, et al., "Combined Multilevel Turbo-code with MR-modulation", IEEE International Conference on Communications, Feb. 1995, pp. 668-672.

Schierl, et al., "Wireless Broadcasting Using the Scalable Extension of H.264/AVC", IEEE International Conference on Multimedia and Expo (ICME-2005) (Amsterdam, The Netherlands), Jul. 6-8, 2005, pp. 884-887.

Wu, et al., "Scalable Video Coding and Transport over Broadband Wireless Networks", Proceedings of the IEEE, Jan. 2001, 22 pages.

\* cited by examiner

BROADCASTING OF DIGITAL VIDEO TO MOBILE TERMINALS

CLAIM OF PRIORITY

This application claims priority from, and is a continuation of, U.S. patent application Ser. No. 13/452,945, filed on Apr. 23, 2012; which is a continuation of U.S. patent application Ser. No. 11/944,823, filed on Nov. 26, 2007, now U.S. Pat. No. 8,185,785; which claims the benefit of U.S. Provisional Patent Application 60/861,593, filed Nov. 28, 2006; each of which is incorporated herein by reference in its entirety.

FIELD OF THE DISCLOSURE

The present disclosure relates generally to communication systems, and particularly to methods and systems for transmitting data over satellite channels.

BACKGROUND

Satellite communication systems are used in a variety of applications, ranging from television broadcast to Internet access. For example, the Digital Video Broadcasting (DVB) consortium specifies a transmission system for hybrid satellite and terrestrial digital television broadcasting to mobile terminals in a standard entitled "Framing Structure, Channel Coding and Modulation for Satellite Services to Handheld Devices (SH) below 3 GHz," DVB Document A111 Revision 1, July, 2007, which is incorporated herein by reference. This standard is referred to as DVB-SH. Other digital video broadcasting standards can be found at www.dvb.org.

Satellite communication channels are typically characterized by deep fades and signal blockage periods, particularly in urban areas. Several methods and systems for reducing the effects of fading and signal blockage are known in the art. Some of these methods employ Error Correction Coding (ECC) and time interleaving. For example, section 5.4.3 of the DVB-SH standard, cited above, describes an exemplary time interleaver configuration.

An exemplary communication method for the Land Mobile Satellite (LMS) channel is described by Ernst et al., in "Transport Layer Coding for the Land Mobile Satellite Channel," Proceedings of the 2004 59th IEEE Vehicular Technology Conference (VTC-2004), Milan, Italy, May 17-19, 2004, volume 5, pages 2916-2920, which is incorporated herein by reference. The paper describes a method, which uses an additional layer of coding at the transport layer and spreads the sent packets over time, so as to create an extremely long virtual interleaver. The paper further investigates the use of Low-Density Parity Check (LDPC) codes.

As another example, Eberlein et al., describe an exemplary Forward Error Correction (FEC) scheme for mobile reception of satellite signals in "Double Use of the Link Margin—Advanced Physical Layer for Satellite Broadcast to Mobile Users," Proceedings of the 2005 Joint Conference: 11th Ka and Broadband Communications Conference and 23rd International Communications Satellite Systems Conference, Rome, Italy, Sep. 25-28, 2005, which is incorporated herein by reference. The paper further describes an air interface that uses very long time interleavers.

Various interleaving schemes for mobile satellite applications are described by Eberlein et al., in "Comparison of Physical Layer Interleaving with Upper Layer Interleaving," Proceedings of the Seventh Workshop on Digital Broadcasting, Erlangen, Germany, Sep. 14-15, 2006, which is incorporated herein by reference.

e video transmission methods, commonly known as Scalable Video Coding (SVC), transmit a composite signal, which comprises multiple components having different quality levels, e.g., different compression depths. The different components are encoded at different levels of ECC or other protection means. A terminal receiving the composite SVC signal decodes the signal components that match its channel conditions and/or computational capabilities. Some aspects of SVC operation are described, for example, by Wu et al., in "Scalable Video Coding and Transport over Broadband Wireless Networks," Proceedings of the IEEE, Volume 89, Issue 1, January, 2001, pages 6-20, which is incorporated herein by reference. Another SVC application is described by Schierl et al., in "Wireless Broadcasting using the Scalable Extension of H. 264/AVC," IEEE International Conference on Multimedia and Expo (ICME-2005), Amsterdam, The Netherlands, Jul. 6-8, 2005, pages 884-887, which is incorporated herein by reference.

SUMMARY

Embodiments of the present invention provide a method for communication, including: encoding data using at least one Error Correction Code (ECC) to generate first and second output data streams; processing the first output data stream to generate a first output signal, which has a first acquisition time; processing the second output data stream to generate a second output signal, which has a second acquisition time that is smaller than the first acquisition time; and transmitting the first and second output signals simultaneously over a communication channel.

In some embodiments, the method further includes receiving and processing the transmitted first and second output signals, so as to decode the at least one ECC and extract the data. In a disclosed embodiment, processing the received first and second output signals includes initiating extraction of the data based on the second output signal, and subsequently transitioning to extract the data based on the first output signal. In another embodiment, processing the received first and second output signals includes computing respective first and second ECC metrics responsively to the received first and second output signals, combining the first and second ECC metrics to produce a joint ECC metric, and decoding the ECC based on the joint ECC metric.

In yet another embodiment, the first output signal is interleaved. In still another embodiment, processing the first and second output data streams includes interleaving the first and second output data streams using respective, different first and second interleaving operations. In an alternative embodiment, the second output signal is not interleaved.

In an embodiment, processing the first and second output data streams includes adapting a rate of the at least one ECC. Adapting the rate may include performing at least one operation selected from a group of operations consisting of puncturing some bits of the encoded data and repeating a part of the bits of the encoded data.

In some embodiments, the data includes a digital video signal representing video images. In a disclosed embodiment, the digital video signal includes at least first and second parts having first and second video quality levels such that the first quality level is better than the second quality level, and encoding the data includes encoding the first and second parts of the digital video signal in the first and second output data streams, respectively. Encoding the data may include encoding the first and second parts of the digital video signal using respective, different first and second error correction codes.

In another embodiment, the second part includes baseline data that represents the video images at the second quality level, and the first part includes enhancement data that enhances the baseline data to represent the video images at the first quality level. Alternatively, the first and second parts represent the video images at the respective first and second quality levels independently of one another.

In yet another embodiment, transmitting the first and second output signals includes canceling a relative delay between the transmitted signals. In still another embodiment, encoding the data includes encoding the data using a systematic ECC to produce coded bits and uncoded bits, and assigning the uncoded bits to only the second output data stream.

In some embodiments, processing the first output data stream includes interleaving the first output data stream by de-multiplexing the first output data stream into multiple branches having respective delays in accordance with a random distribution order. De-multiplexing the first output data stream may include storing indices of the multiple branches in a table according to the random distribution order, and addressing the table by an incrementing counter. Additionally or alternatively, de-multiplexing the first output data stream includes incrementing a counter value, splitting the counter value into first and second parts, addressing a table that holds a random permutation by the first part of the counter value to produce a randomly-permutated output, and calculating the random distribution order based on the randomly-permutated output of the table and on the second part of the counter value.

In a disclosed embodiment, transmitting the first and second output signals includes transmitting the signals via a satellite.

There is also provided, in accordance with an embodiment of the present invention, a communication system, including: multiple delay lines having respective inputs and outputs, which are coupled to apply respective delays between the input and the outputs; an input de-multiplexer, which is configured to accept a sequence of indices of the delay lines, to accept input data and to distribute the input data among the inputs of the multiple delay lines in accordance with the sequence of the indices; an output multiplexer, which is configured to multiplex the outputs of the multiple delay lines in accordance with the sequence of the indices; and a control unit, which includes a counter and a table holding a random permutation and is configured to increment a value of the counter, to split the value into first and second parts, to address the table by the first part of the value to produce a randomly-permutated output, and to generate the sequence of the indices based on the randomly-permutated output of the table and on the second part of the value, so as to scan the delay lines in a random order.

The present disclosure will be more fully understood from the following detailed description of the embodiments thereof, taken together with the drawings in which:

DETAILED DESCRIPTION

Overview

Figure 1:
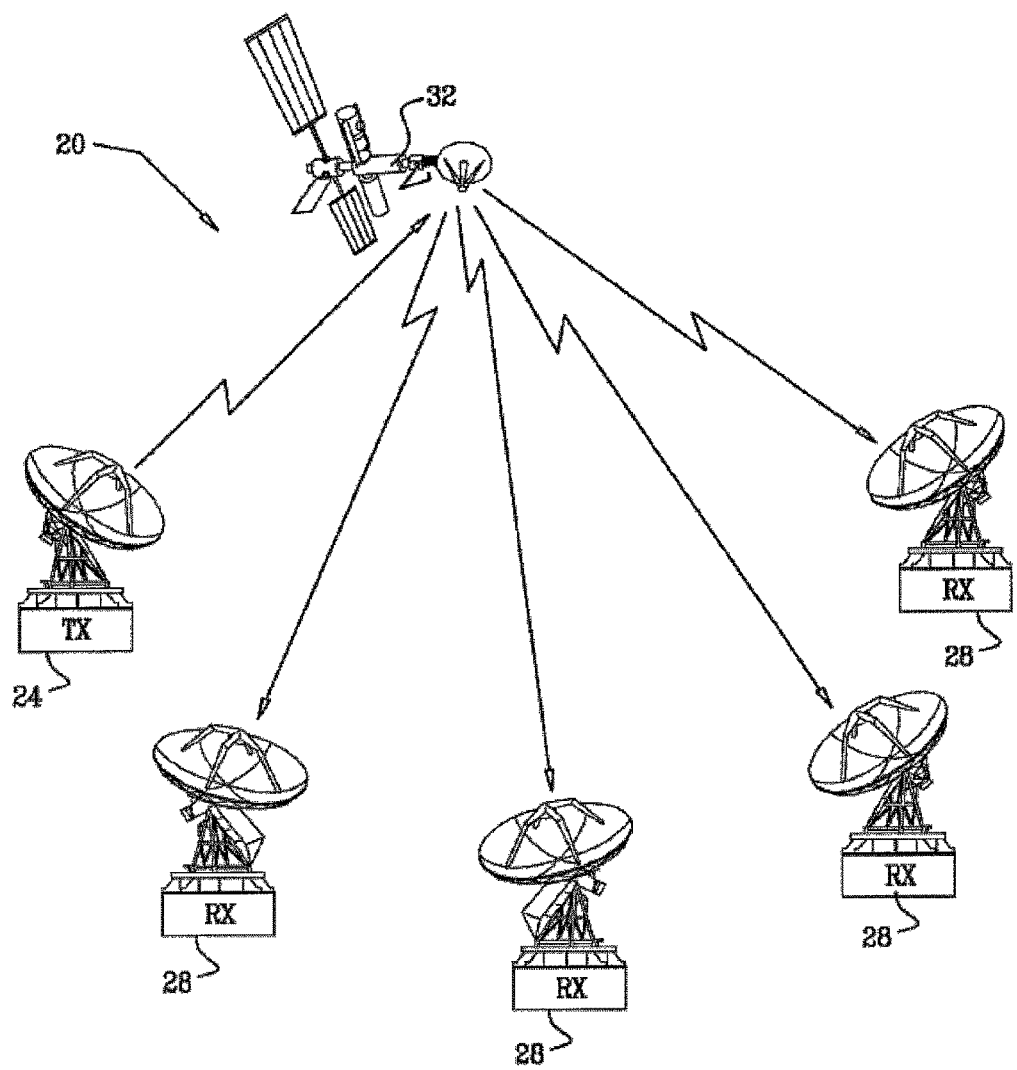
FIG. 1 is a block diagram that schematically illustrates a satellite communication system, in accordance with an embodiment of the present invention.

The communication channel between a satellite and a terrestrial receiver often suffers from deep fading and signal blockage periods, especially in urban areas. Signal blockage is particularly severe when attempting to receive signals from a geostationary (GEO) satellite, a scenario in which the Line Of Sight (LOS) between the satellite and the receiver often has a low elevation angle and may be obstructed by buildings and other objects. Moreover, when the receiver is mobile, e.g., placed in a small vehicle, its reception antenna is typically small and has limited gain and directivity. As a result, the receiver may experience marginal Signal-to-Noise Ratios (SNR) and deep fading. Some mobile satellite video applications use a small number of channels per transponder frequency, in order to provide adequate video bit rate under these conditions.

Some known satellite communication methods attempt to reduce the effects of signal blockage by (1) encoding the transmitted signal using an Error Correction Code (ECC) and (2) interleaving the encoded data bits over a long time period, which is often significantly longer than the expected blockage periods. The interleaving operation spreads the encoded bits that suffer from blockage over time, so as to enable the ECC decoder to reconstruct these bits.

In some satellite communication applications, however, the long interleaving operation causes considerable operational difficulties. For example, in satellite television broadcast applications, the long interleaving period causes intolerable delay when switching from one satellite transponder channel to another or otherwise beginning to receive a new channel. When a receiver begins receiving a new channel whose data is interleaved, the receiver will be able to reliably decode the data only after receiving the data for a duration that is on the order of the interleaving period. In order to effectively reduce blockage effects, the data transmitted over a satellite channel is often interleaved over several tens of seconds, and up to several minutes. As a result, switching channels ("zapping") or beginning to receive a new channel has a latency of this magnitude, which is intolerable to most users.

In view of the difficulties associated with long interleaving periods, embodiments of the present invention that are described hereinbelow provide improved methods and systems for transmitting data over satellite channels. In some embodiments, a transmitter transmits data to a receiver via a satellite. The transmitter encodes the data by an Error Correction Code (ECC). The transmitter comprises two separate and parallel processing chains, which process the encoded data for transmission. One processing chain comprises a long interleaver, whereas the other chain comprises a short interleaver or no interleaver at all. The transmitter processes the encoded data in parallel using the two processing chains, multiplexes the outputs of the two chains and transmits the multiplexed signal.

Thus, the transmitter transmits a composite signal, which comprises two signal components, such that a first component has a long interleaving period and a second component has little or no interleaving. The receiver receives the composite signal and reconstructs the data from one or both of its components. Because the first component is interleaved over a long interleaving period, it has a long acquisition time, whereas the second component has a much shorter acquisition time. In some embodiments, the receiver uses the first component for steady-state reception, and the second component for initial acquisition of a new channel, e.g., when zapping from one satellite transponder to another.

In the context of the present patent application and in the claims, the term "acquisition time" is used to describe a property of a transmitted signal, which quantifies the minimal period of time needed for a receiver to begin outputting useful data after initially receiving the signal. For example, when the signal is interleaved, the receiver would start outputting useful data when the number and quality of the symbols at the output of the de-interleaver enable the ECC decoder to successfully decode the ECC words. Thus, the acquisition time increases when the interleaver length increases, and vice versa.

In some embodiments, the receiver combines information from both signal components in a manner that assigns more weight to the first component during steady-state reception, and to the second component during new channel acquisition. For example, the transmitter may transmit the same data in both signal components. The receiver computes ECC metrics of corresponding encoded bits extracted from the two signal components, combines the metrics into a single joint metric, and decodes the ECC using the joint metric.

In alternative embodiments, the transmitter transmits video that is represented at a certain baseline quality using one of the processing chains, and enhancement data that provides better video quality in the other processing chain. The transmitter applies little or no interleaving to the baseline video data, and long interleaving to the enhancement data. Thus, the receiver is able to initially receive and decode the baseline quality video with small latency, and then improve the video quality over time when enhancement data becomes available. Typically, the receiver should receive both baseline and enhancement data in order to reconstruct the high quality video.

In some embodiments, the transmitter and receiver adapt the code rate in the first and/or second processing chains by repeating and/or deleting (puncturing) some of the encoded bits. The receiver and transmitter may use different rates of repetition and/or puncturing in the two processing chains.

In summary, the methods and systems described herein provide the receiver with two signal components, one that is more robust against fading and blockage but has longer latency, and one that is less protected but has small latency. The receiver may combine, select or otherwise trade-off the information conveyed in the two signal components. For example, the methods and systems described herein enable the receiver to initiate reception of a satellite video channel with small latency, and gradually improve the reception quality. In some embodiments, the different latency components are used in conjunction with an SVC scheme, so that video having a certain basic quality can be initially received with small latency, and the video quality can then be improved over time.

The methods and systems described herein thus enable providing robust satellite communication in applications that are sensitive to acquisition time, such as applications that transmit multiple video channels over multiple satellite transponders, rather than being restricted to off-line applications such as file transfer.

System Description

Figure 2:
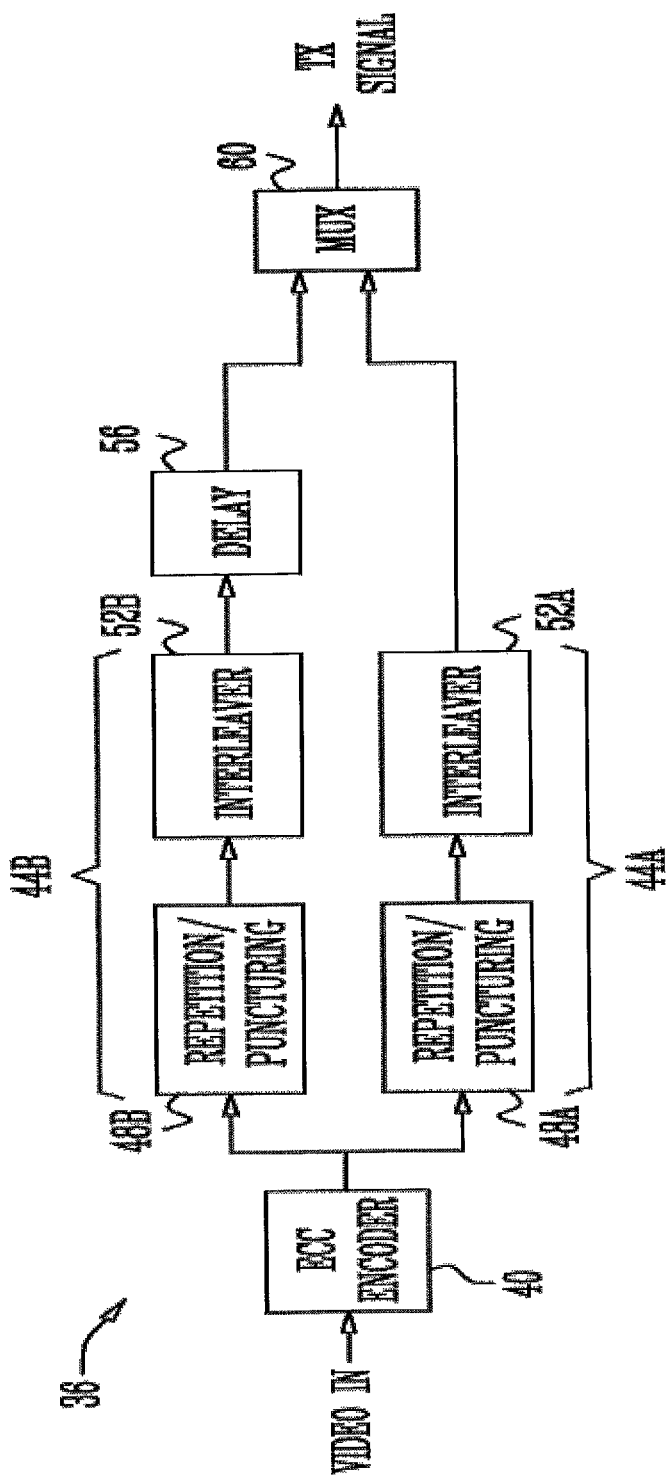
FIG. 2 is a block diagram that schematically illustrates a transmitter in a satellite communication system, in accordance with an embodiment of the present invention.

FIG. 2 is a block diagram that schematically illustrates a transmitter 36, which may be used as TX 24 in system 20 of FIG. 1 above, in accordance with an embodiment of the present invention. Transmitter 36 accepts digital video for transmission. The transmitter comprises an encoder 40, which encodes the input video data by a suitable Error Correction Code (ECC). Encoder 40 may use any suitable ECC, such as various block and convolution codes. For example, the ECC may comprise a Low-Density Parity Check (LDPC) code, a turbo code, a Reed-Solomon (RS) code, a trellis or other signal-space, a concatenated code, or any other suitable ECC. The ECC may be systematic or non-systematic. The code may be designed to correct blocked bits (erasures) and/or random errors (such as errors due to noise).

Transmitter 36 comprises two processing chains 44A and 44B, each processing a respective data stream. Processing chain 44A comprises a rate adaptation module 48A and an interleaver 52A. Processing chain 44B comprises a rate adaptation module 48B, an interleaver 52B and a delay module 56. The outputs of the two processing chains are multiplexed by a multiplexing module 60.

Rate adaptation modules 48A and 48B modify the coding rate of the encoded data produced by encoder 40. The rate adaptation modules may decrease the code rate (increase the level of redundancy introduced by the code) by repeating some of the encoded bits. Additionally or alternatively, the rate adaptation modules may increase the code rate (decrease the level of redundancy) by deleting some of the encoded bits. The bit deletion operation is commonly known as puncturing. Each of modules 48A and 48B may apply a different rate of repetition and/or puncturing, in order to modify the ECC code rate, as desired. In some embodiments, one of the rate adaptation modules, or both modules, can be omitted.

Figure 9:
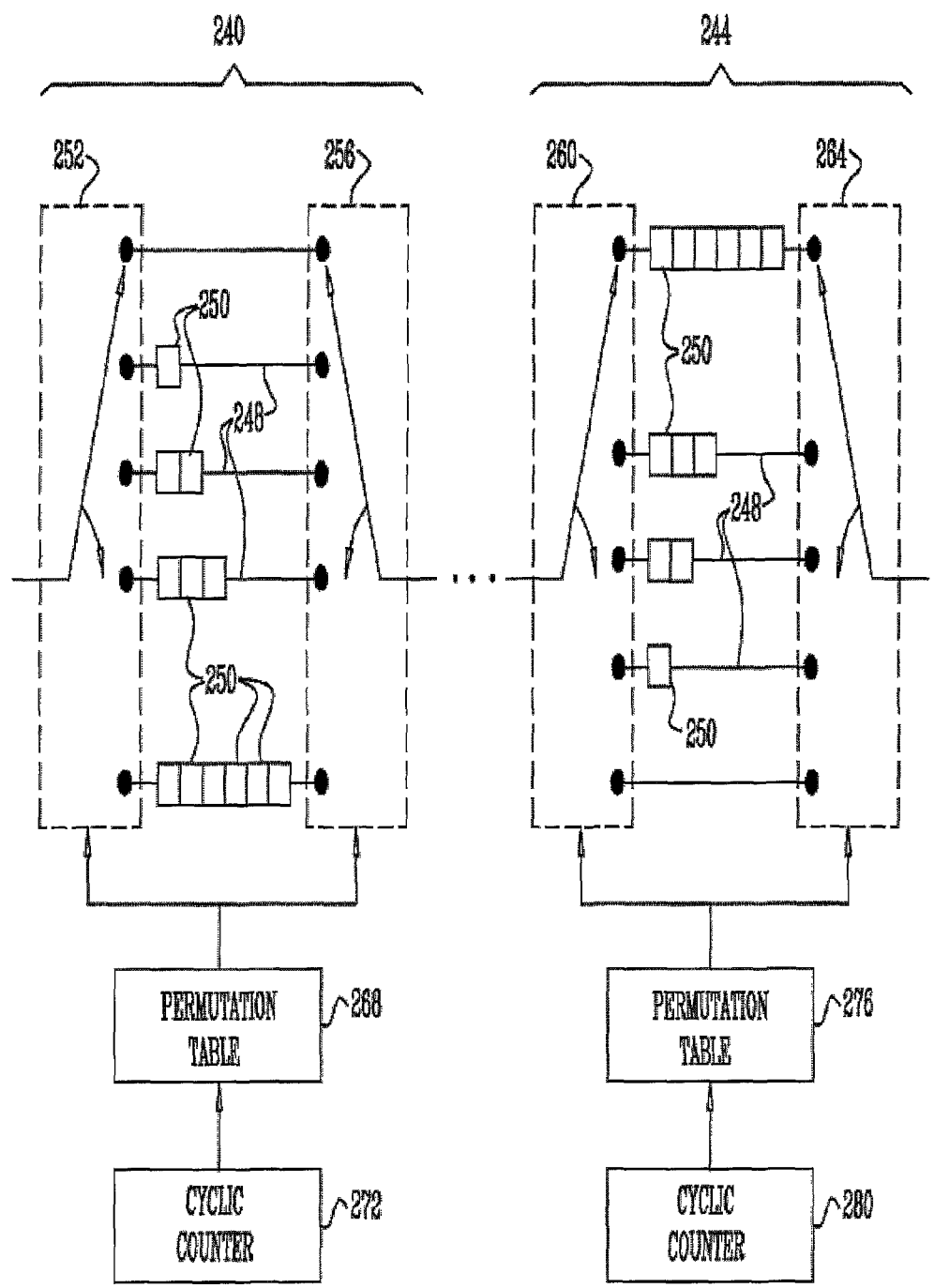
FIG. 9 is a block diagram that schematically illustrates an interleaves and a de-interleaver, in accordance with an embodiment of the present invention.

Interleavers 52A and 52B interleave the outputs of modules 48A and 48B, respectively. The interleaving operation spreads the encoded data of each code word over a certain time period, which is referred to as the interleaving period. In other words, bits that are adjacent to one another at the interleaver output typically belong to different code words. Interleavers 52A and 52B may comprise any suitable interleaver configuration, such as various block and convolutional interleavers known in the art, or multiple interleavers connected in cascade. An exemplary interleaver configuration that can be used for this purpose is shown in FIG. 9 below.

Interleaver 52A has a long interleaving period, which is chosen based on the expected characteristics of the satellite channel Typically, interleaver 52A is designed so that its interleaving period is significantly longer than the expected signal blockage periods. For example, in a typical urban satellite channel, the interleaving period may be in the range of several tens of seconds, and up to several minutes, although other values can also be used. Since the length of the interleaving period determines the latency of the processing chain, the interleaving period may also be chosen based on a delay requirement specified for the chain.

The long interleaving and de-interleaving operations usually involve caching the data that is processed within the interleaving period. The transmitter and receiver often use large memories for this purpose. In some receivers, each received symbol is represented by a soft metric (usually 4-8 bits per symbol), and therefore the de-interleaver memory is particularly large. In a typical receiver de-interleaver, the memory size is on the order of 0.5-2 Gigabytes, although other sizes can also be used.

Interleaver 52B is designed to have an interleaving period that is significantly shorter than the interleaving period of interleaver 52A. In some embodiments, interleaver 52B is omitted altogether, so that processing chain 44B does not perform any interleaving.

Thus, processing chain 44A applies a long interleaving operation that provides effective protection against fading and blockage, but has high latency. Processing chain 44B, on the other hand, applies little or no interleaving, but has small latency.

Delay module 56 matches the timing of the two processing chains. Multiplexing module 60 multiplexes the outputs of the two chains. Module 60 may apply any suitable multiplexing type, such as, for example, Time-Division Multiplexing (TDM), Frequency-Division Multiplexing (FDM), Code-Division Multiplexing, space multiplexing or polarization multiplexing. The multiplexed signal is converted to an analog Radio Frequency (RF) signal and transmitted toward the satellite, so as to be received by the receivers.

Thus, transmitter 36 transmits a composite signal, which comprises two signal components. A first component is interleaved over a long time period, whereas the second component has little or no interleaving.

Various transmitter and receiver elements that are not necessary for the understanding of the disclosed methods and systems (such as Analog to Digital (A/D) and Digital to Analog (D/A) converters, various Radio Frequency (RF) elements, and antennas) are omitted from FIG. 2, as well as from other figures in the present disclosure, for the sake of clarity.

Figure 3:
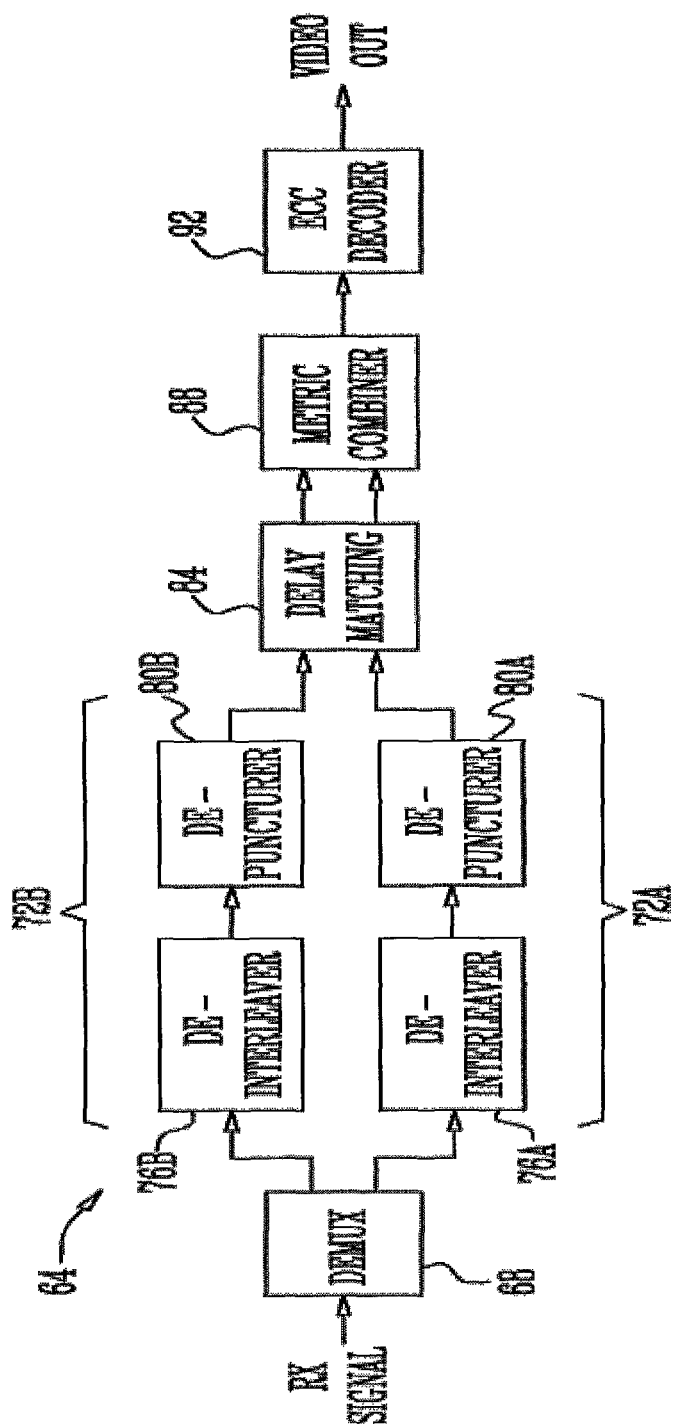
FIG. 3 is a block diagram that schematically illustrates a receiver in a satellite communication system, in accordance with an embodiment of the present invention.

FIG. 3 is a block diagram that schematically illustrates a receiver 64, which may be used as RX 28 in system 20 of FIG. 1 above, in accordance with an embodiment of the present invention. For example, receiver 64 can be used to receive the composite signal transmitted by transmitter 36 of FIG. 2 above.

Receiver 64 receives the composite signal transmitted by transmitter 36. (Circuitry such as antennas, RF circuitry and A/D circuitry have been omitted from the figure for the sake of clarity.) The receiver comprises a de-multiplexing module 68, which separates the composite signal into the two signal components. The receiver comprises two processing chains 72A and 72B, which respectively process the signal components produced by processing chains 44A and 44B of the transmitter.

Processing chain 72A comprises a de-interleaver 76A and a rate adaptation module 80A. Processing chain 72B comprises a de-interleaver 76B and a rate adaptation module 80B. De-interleaver 76A is designed to de-interleave the data interleaved by interleaver 52A of the transmitter. Similarly, de-interleaver 76B is designed to de-interleave the data interleaved by interleaver 52B. Modules 80A and 80B apply de-puncturing, so as to respectively reverse the puncturing introduced by modules 48A and 48B of the transmitter. A delay matching module 84 matches the timing of the signal components.

The two delay-matched signal components are provided to a metric combining module 88, which computes ECC metrics associated with bits or symbols of the signal components, and combines them to produce joint metrics. An ECC decoder 92 subsequently decodes the ECC based on the joint metrics. The type of metrics computed by module 88 typically depends on the type of ECC being used, and on the configuration and functionality of the ECC decoder. Various types of ECC metrics are known in the art, and any suitable metric type can be used. For example, the metrics may comprise Euclidean distances, Log-Likelihood Ratios (LLR), Signal to Noise Ratio (SNR) estimates and/or Mean Square Error (MSE) estimates. The metrics may be calculated based on channel state information that is available to the receiver, such as indications of clear or blocked line of sight.

The ECC metrics can also be used for carrying out the de-puncturing operations by modules 80A and 80B. For example, De-puncturing can be performed by assigning the punctured symbols the lowest possible ECC metrics (e.g., LLR=0) at the receiver.

FIG. 3 shows an embodiment in which the metrics are computed by module 88 after de-interleaving, for the sake of clarity. In some embodiments, however, the metric computation is performed prior to de-interleaving, typically at the receiver front-end before de-multiplexing module 68. Thus, the functionality of module 88 may be split between two modules—a metric computation module in the receiver front-end and a metric combining module following de-interleaving.

Typically, module 88 compares pairs of metrics, which are associated with corresponding bits or symbols from the two signal components. Thus, when a certain bit suffers from noise or distortion in one of the signal components but is received reliably in the other signal component, module 88 will produce a high metric value for this bit in one of the signal components and a low metric value in the other component. Module 88 combines the metric values of corresponding bits in the two signal components, to produce joint metrics. Module 88 may use any suitable scheme for combining the metrics, such as Maximum Ratio Combining (MRC), Maximum Likelihood (ML) combining and/or various font's of weighting. ECC decoder decodes the ECC using the joint metrics, so as to reconstruct the data. The receiver produces the reconstructed video data as output.

The joint use of ECC metrics computed over the two signal components enables the receiver to reconstruct the data based on the signal component having the long interleaving period, the signal component having the short interleaving period, or a combination of both. This capability enables the receiver to trade between resilience to blockage and small channel acquisition time gradually and smoothly.

For example, in the initial stages of receiving a new channel, the metrics computed over the data produced by processing channel 72B (having little or no interleaving) will typically have higher quality than the metrics computed over the data of processing chain 72A. As data fills de-interleaver 76A, the metrics of processing chain 72A will gradually improve. Thus, the joint metric gradually shifts from depending on the component having the small channel acquisition time to depending more and more on the component having the better blockage protection. In general, the signal component having the long interleaving period will typically produce high quality metrics during steady-state reception, but will require a long initialization period when attempting to receive a new channel over a new transponder. During these initial periods, the joint metric will depend more on the signal component having little or no interleaving.

Communication Method Description

Figure 4:
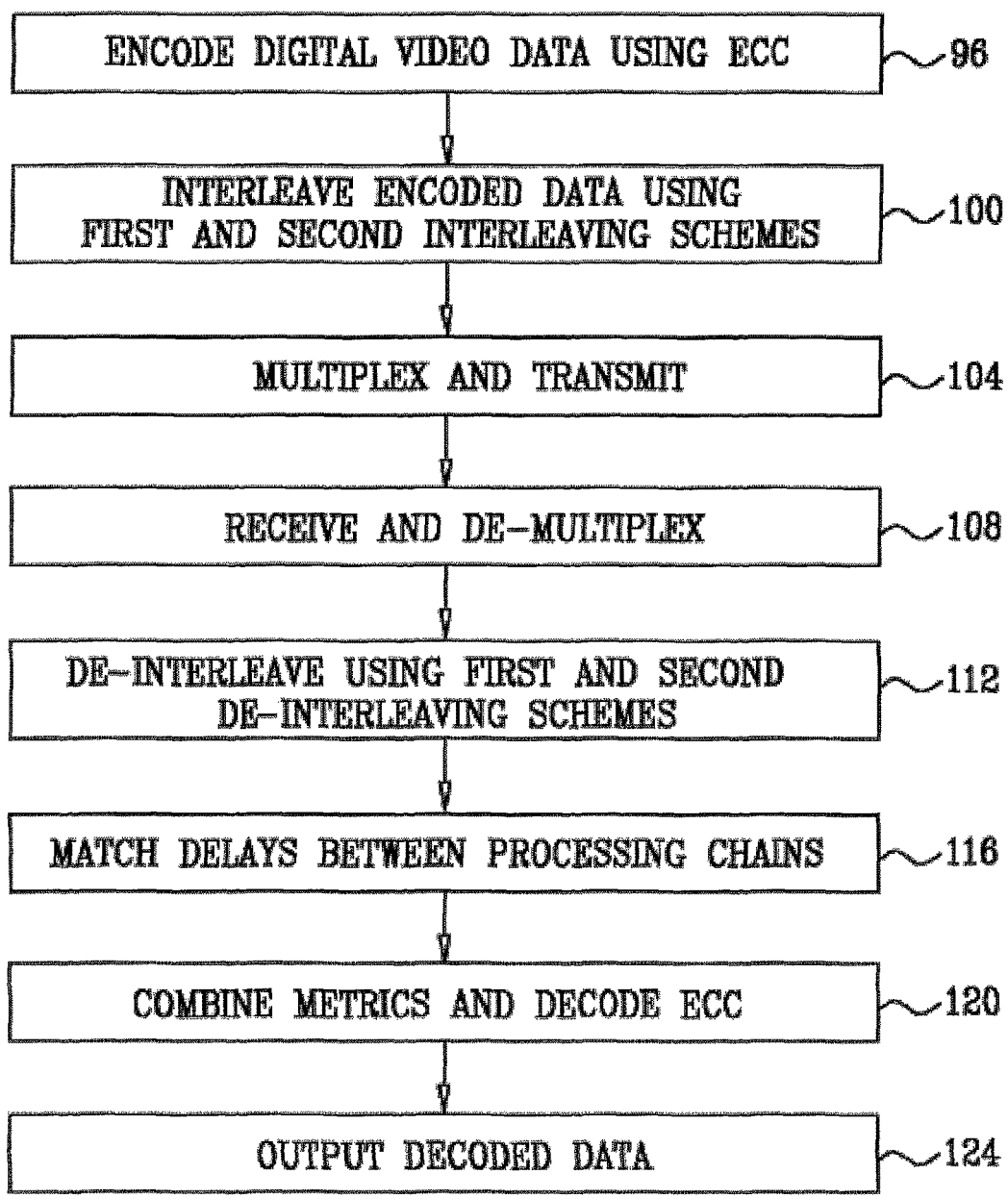
FIG. 4 is a flow chart that schematically illustrates a method for satellite communication, in accordance with an embodiment of the present invention.

FIG. 4 is a flow chart that schematically illustrates a method for satellite communication, in accordance with an embodiment of the present invention. The method begins with ECC encoder 40 of transmitter 36 encoding input video data using an ECC, at an encoding step 96. The transmitter interleaves the encoded data with two different interleaving schemes, using processing chains 44A and 44B, at an interleaving step 100. In some embodiments, the signal is interleaved in only one of the processing chains, and remains non-interleaved in the other. The processing chains may also apply repetition and/or puncturing. Multiplexing module 60 multiplexes the outputs of the two interleaving schemes and transmits the composite signal over a wireless (e.g., satellite) channel, at a combining and transmission step 104.

Receiver 64 receives the composite signal and de-multiplexing module 68 separates the two signal components, at a de-multiplexing step 108. The receiver de-interleaves each signal component using an appropriate de-interleaving scheme, using processing chains 72A and 72B, at a de-interleaving step 112. If one of the signal components is non-interleaved, no de-interleaving is applied to this component. The receiver processing chains may also apply de-puncturing, if puncturing was applied at the transmitter.

Delay matching module 84 of the receiver matches the relative timing between the two signal components, at a delay matching step 116. Metric combining module 88 computes ECC metrics for the encoded bits of the two signal components, at a metric computation and decoding step 120. Module 88 combines ECC metrics of corresponding bits of the two signal components, to produce joint metrics of these bits. ECC decoder 92 decodes the ECC based on the joint metrics, so as to reconstruct the data. The receiver produces the reconstructed data as output, at an output step 124.

System Configurations Supporting Scalable Video Coding

In some embodiments, transmitting signal components having different interleaving periods is used in conjunction with multi-resolution video transmission schemes, such as Scalable Video Coding (SVC). In these embodiments, the video information is represented in two or more levels of quality. Different quality levels may correspond, for example, to different levels of compression or to different resolutions. In some embodiments, higher quality levels are represented as enhancement information, which provide enhanced quality when used together with the data in lower-quality levels.

In the exemplary embodiments that are described below, the video information is represented using two data layers, which are referred to as baseline and enhancement data. The baseline data comprises basic-quality video data. The enhancement data, together with the baseline data, produces higher-quality video. For example, the video signal may conform to the MPEG-4 or H.264 standards, as are known in the art.

The transmitter applies long interleaving to the enhancement data, and little or no interleaving to the baseline data. Thus, the receiver is able to start receiving a new channel and decode the baseline data with small latency. When the enhancement data is decoded (after a longer latency period caused by the long interleaving operation), the receiver begins producing higher quality video.

Figure 5:
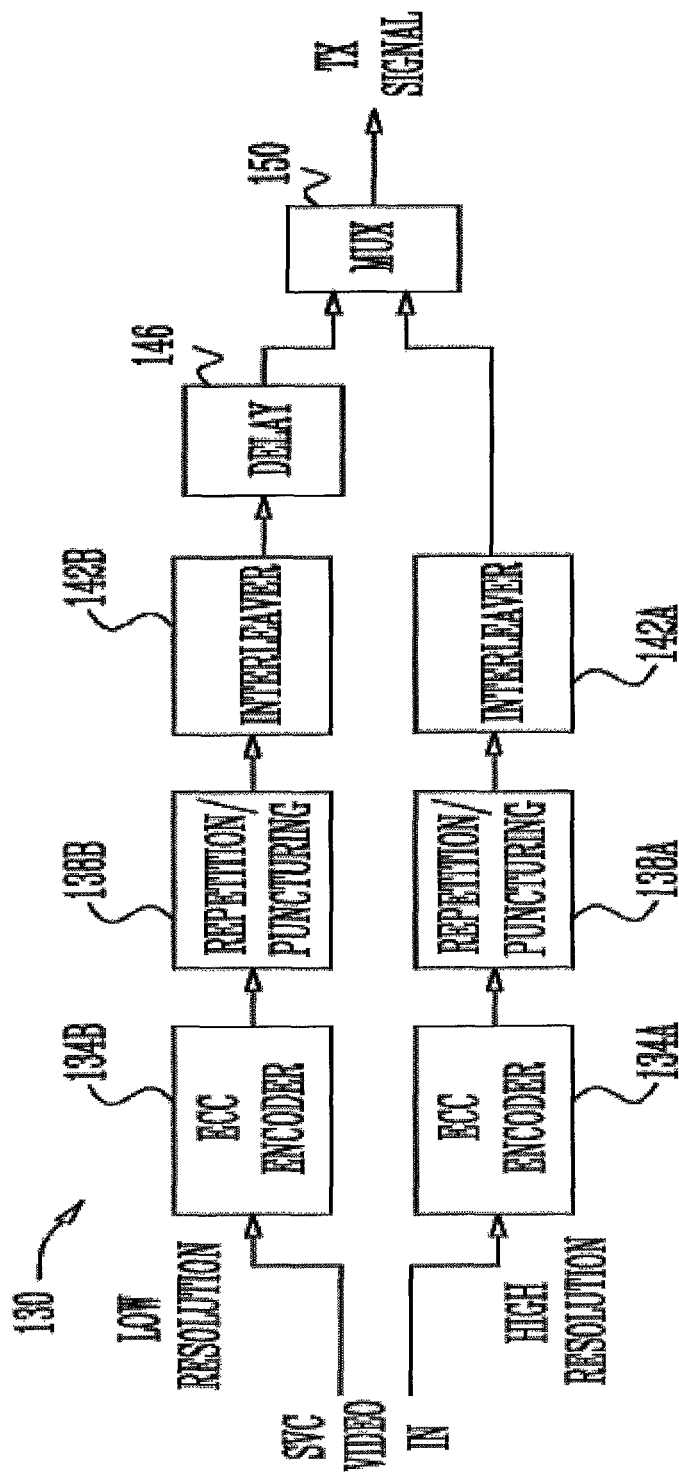
FIG. 5 is a block diagram that schematically illustrates a transmitter in a satellite communication system, in accordance with another embodiment of the present invention.

FIG. 5 is a block diagram that schematically illustrates a transmitter 130, which may be used as TX 24 in system 20 of FIG. 1 above, in accordance with an embodiment of the present invention. Transmitter 130 accepts high resolution data and encodes it using an ECC encoder 134A. Optionally, a rate adaptation module 138A applies repetition and/or puncturing to the encoded high resolution data. An interleaver 142A interleaves the output of module 138A.

Similarly, low resolution data is encoded by an ECC encoder 134B, optionally rate-adapted by a rate adaptation module 138B and interleaved by an interleaver 142B. In some embodiments, interleaver 142B is omitted and the low resolution data is not interleaved. A delay module 146 matches the delays of the two transmitter processing chains, and a multiplexing module 150 (similar to module 60 of FIG. 2 above) multiplexes the two signal components to produce a composite signal.

As noted above, interleaver 142A, which interleaves the high resolution data, is designed to have a long interleaving period, so as to effectively reduce the effects of blockage and fading. Interleaver 142B, if one is used, is typically designed to have small latency. Typically but not necessarily, the ECC used by encoder 134A to encode the high resolution data is optimized for operating with erasures, since this processing chain often suffers from signal blockage. The ECC used by encoder 134B to encode the low resolution data, on the other hand, is typically optimized for operation when line of sight is available, e.g., optimized for correcting random errors.

In some embodiments, the baseline data is transmitted with low resolution and a relatively weak ECC, thus using relatively little resources (e.g., transmit power). The remaining resources permit transmitting the enhancement data with high resolution and a strong ECC.

Figure 6:
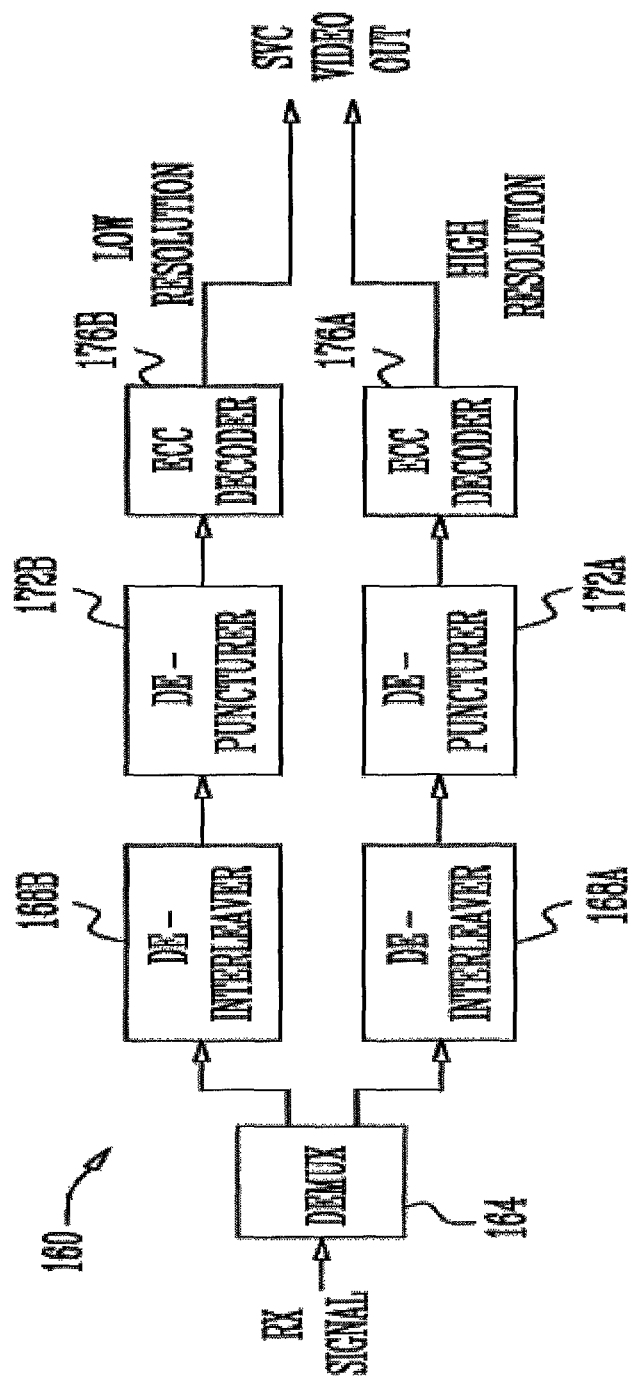
FIG. 6 is a block diagram that schematically illustrates a receiver in a satellite communication system, in accordance with yet another embodiment of the present invention.

FIG. 6 is a block diagram that schematically illustrates a receiver 160, which may be used as RX 28 in system 20 of FIG. 1 above, in accordance with an embodiment of the present invention. Receiver 160 can be used, for example, to receive and decode the composite signal transmitted by transmitter 130 of FIG. 5 above.

Receiver 160 comprises a de-multiplexer 164, similar to de-multiplexer 68 of FIG. 3 above, which separates the composite signal into the two signal components. The component corresponding to the high resolution data is de-interleaved by a de-interleaver 168A, optionally rate-adapted by a rate adaptation module 172A, and decoded by an ECC decoder 176A. The component corresponding to the low resolution data is de-interleaved by a de-interleaver 168B, optionally rate-adapted by a rate adaptation module 172B, and decoded by an ECC decoder 176B. The reconstructed low- and high-resolution data is provided as output.

Figure 7:
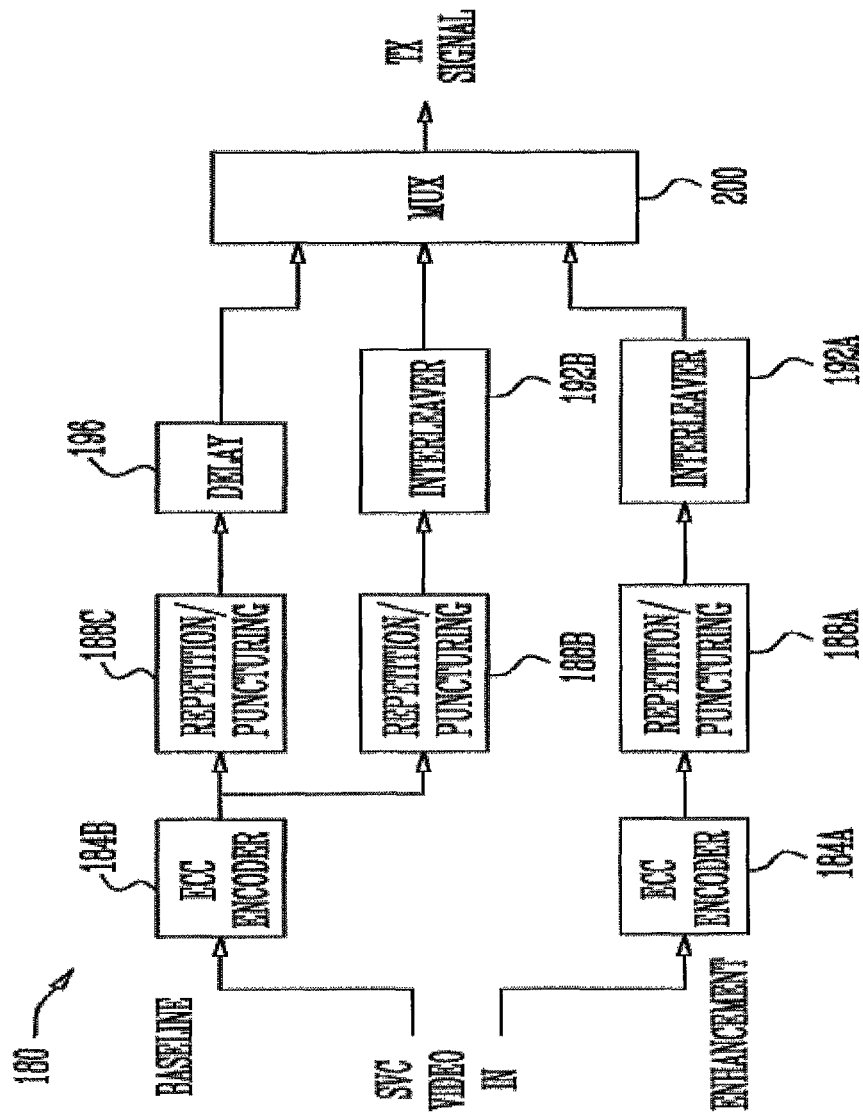
FIG. 7 is a block diagram that schematically illustrates a transmitter in a satellite communication system, in accordance with still another embodiment of the present invention.

FIG. 7 is a block diagram that schematically illustrates a transmitter 180, in accordance with an alternative embodiment of the present invention. In the configuration of transmitter 180, the enhancement video data is processed by a processing chain comprising an ECC decoder 184A, a rate adaptation module 188A and an interleaver 192A, similarly to the processing of enhancement data performed by transmitter 130 of FIG. 5 above. The baseline data, however, is encoded by an ECC encoder 184B and processed by two separate processing chains, similarly to the processing performed by transmitter 36 of FIG. 2 above. One processing chain that processes the baseline data comprises a rate adaptation module 188B and an interleaver 192B, and the other comprises a rate adaptation module 188C and a delay module 196. The second processing chain has no interleaver. The outputs of the three processing chains are multiplexed by a multiplexing module 200, to produce a composite signal for transmission.

In an exemplary implementation, the video signal conforms to the MPEG-4 or H.264 standards. The baseline and enhancement data are encoded by a low rate LDPC code, such as a rate 0.1-0.25 code. In the present example, both baseline and enhancement data are encoded using the same code but subjected to different puncturing or repetition. Rate adaptation module 188B punctures fewer bits (or repeats more bits) than module 188A, so that the baseline data has better redundancy. Thus, receivers that experience bad channel conditions will be able to decode the baseline data, whereas receivers enjoying good channel conditions will be able to decode both baseline and enhancement data and obtain better video quality. Rate adaptation module 188C may puncture all redundancy bits, or alternatively leave some redundancy bits to enable correction of random errors.

In the present example, encoder 184B encodes the baseline using an LDPC code. The video data at the decoder input is divided into K-bit packets. Encoder 184B encodes each K-bit packet to produce an N-bit code word. Rate adaptation module 188C leaves Nd bits from each N-bit code word unpunctured, while rate adaptation module 188B leaves Nb bits from each N-bit code word unpunctured. Multiplexing module 200 multiplexes Nd bits from the output of delay module 196 with Nb bits from the output of interleaver 192B.

For a total transmission rate of 15 Mbps, the baseline transmission rate may be 10 Mbps and the enhancement transmission rate may be 5 Mbps. For a total code length (resulting, for example from concatenating an LDPC code and a BCH code) of 100,000 bits, a code rate of 0.1 and a tolerable transmission delay of 100 Seconds, the parameters shown in TABLE 1 may be used. When using the parameter values of TABLE 1, the baseline video has a rate of ~833 Kbps, and the enhancement video has a rate of ~1.25 Mbps.

TABLE 1

| Parameter | Value |
| --- | --- |
| $N_d$ | 20,000 |
| $N_b$ | 100,000 (no puncturing) |
| Interleaver delay | $15 \times 10^8$ bits |
| Number of interleaver delay lines | 15,000 |
| Delay increment per delay line | 7 |
| Number of bits per frame of the enhancement channel after puncturing ($N_e$) | 40,000 |

Figure 8:
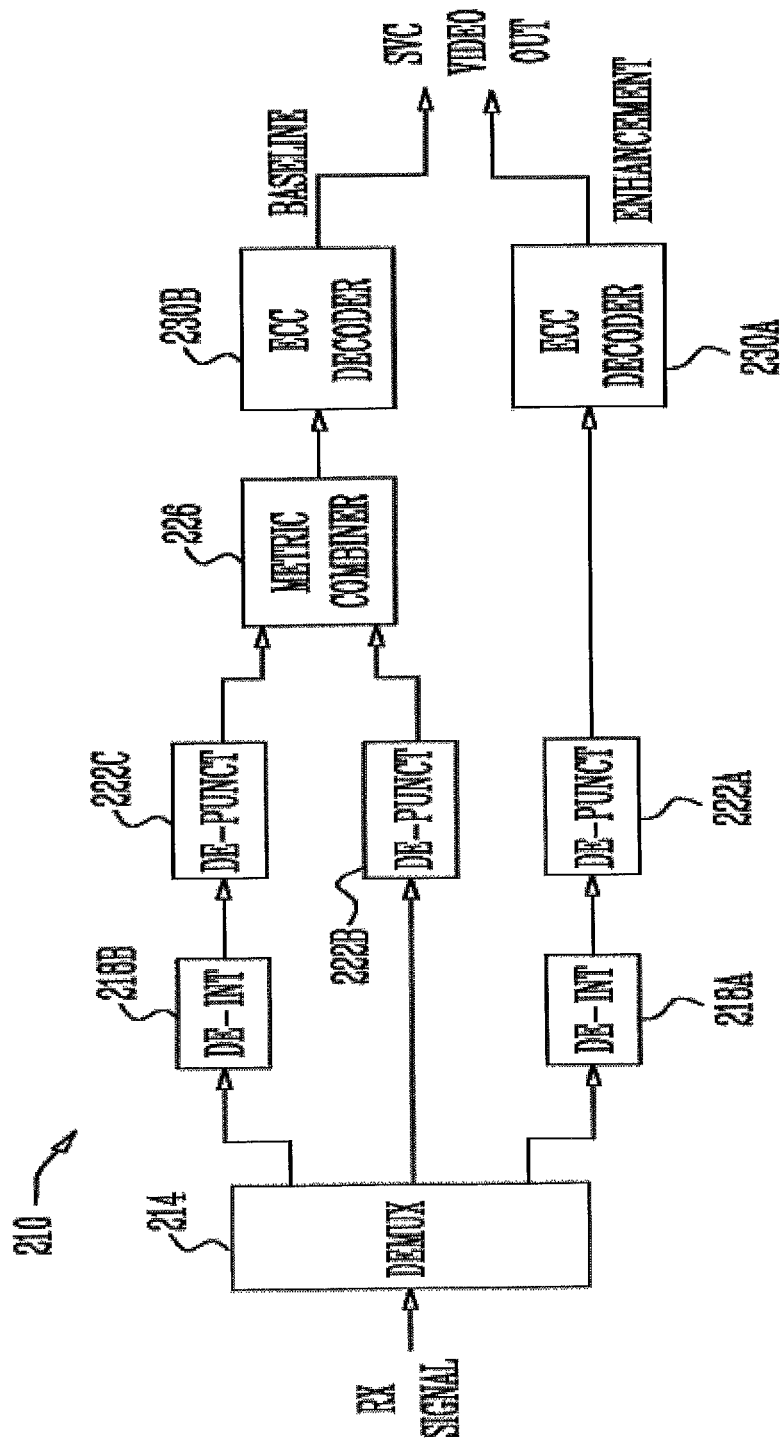
FIG. 8 is a block diagram that schematically illustrates a receiver in a satellite communication system, in accordance with another embodiment of the present invention.

FIG. 8 is a block diagram that schematically illustrates a receiver 210, which can be used for receiving the signals produced by transmitter 180 of FIG. 7 above, in accordance with an embodiment of the present invention. The received composite signal is separated to its three components by a de-multiplexer 214. The enhancement data is processed by a processing chain comprising a de-interleaver 218A, a rate adaptation module 222A and an ECC decoder 230A.

The baseline data is processed by two processing chains, corresponding to the two processing chains of transmitter 180 of FIG. 7 above. The first processing chain comprises a de-interleaver 218B and a rate adaptation module 222C. The second processing chain comprises a rate adaptation module 222B, and does not apply any interleaving. The outputs of the two processing chains are processed by a metric combining module 226. Module 226 computes joint ECC metrics based on the outputs of the two processing chains, similarly to module 88 of FIG. 3 above. An ECC decoder 230B decodes the ECC of the baseline data.

The two processing chains of FIGS. 7 and 8 can also be used to transmit video at two different quality levels (e.g., different resolutions). Typically, the two signals originate from the same video source and are compressed at two different compression levels. In this scheme, unlike schemes that transmit baseline and enhancement data, each video signal is self-contained and can be used to produce video at the receiver independently of the other signal. Typically, the lower-quality signal has a strong ECC and the higher-quality signal has a weaker ECC.

Interleaver and De-Interleaver Configurations

FIG. 9 is a block diagram that schematically illustrates a convolutional interleaver 240 and a convolutional de-interleaver 244, in accordance with an embodiment of the present invention. The interleaver and de-interleaver configurations of FIG. 9 can be used to implement any of the interleaver/de-interleaver pairs in the various transmitter and receiver configurations described herein.

Interleaver 240 comprises multiple digital delay lines 248, which apply respective delays between their inputs and outputs. In some embodiments, each delay line 248 comprises zero or more delay stages 250. Each delay stage holds IB data bits, whose bits are not interleaved with one another. (Constructing the delay lines from basic IB-bit units reduces the number of read and write operations to and from the interleaver and de-interleaver.) The interleaver comprises an input de-multiplexer 252, which accepts input data to be interleaved, and distributes the data among the different delay lines. An output multiplexer 256, which is synchronized with de-multiplexer 252, collects the delayed data from the outputs of the delay lines and multiplexes them to form an interleaved data stream.

De-interleaver 244 comprises multiple digital delay lines, whose delays are complementary to the delays of the corresponding delay lines in interleaver 240. Thus, de-interleaver 244 reverses the interleaving operation performed by interleaver 240. The de-interleaver comprises an input de-multiplexer 260, which distributes the interleaved data among the different delay lines. An output multiplexer 264, which is synchronized with de-multiplexer 260, collects the delayed data from the outputs of the delay lines and multiplexes them to form a reconstructed, non-interleaved data stream. De-multiplexer 260 and multiplexer 264 of the receiver are synchronized with de-multiplexer 252 and multiplexer 256 of the transmitter.

In some cases, the signal blockage periods may be longer than the interleaving period. Such scenarios may be cause by long periods of line-of-sight blockage, as well as after switching to a new channel, when the de-interleaver is initially blocked and starts to fill gradually. In these scenarios, the output of the de-interleaver may still contain sequences of blocked (erased) symbols. These residual erased intervals may degrade the performance of a repetition scheme, if one is used, since different replicas of a certain bit are likely to be in the same state (blocked or non-blocked). Moreover, the ECC itself may be sensitive to long erasure intervals.

In order to reduce the effects of such residual blocked intervals, the interleaver and de-interleavers described herein scan the delay lines in a random order. Random scanning spreads the residual blockage bursts at the de-interleaver output, so that repeated bits (bits repeated by the repetition scheme) will randomly fall in blocked or non-blocked intervals. It should be understood that the term "random order" is used broadly to describe both random and pseudo-random orders, which may be determined using any suitable random or pseudo-random number generation means.

In interleaver 240, input de-multiplexer 252 and output multiplexer 256 alternate among the delay lines in accordance with a random scanning order. In some embodiments, the interleaver comprises a control circuit, which controls the de-multiplexer and multiplexer so as to scan the delay lines randomly. In the exemplary embodiment of FIG. 9, the interleaver comprises a permutation table 268, which holds a pseudo-random permutation, i.e., a pseudo-random order of scanning the delay lines. A cyclic counter 272 provides a cyclicly-incrementing index for addressing the permutation table. The indices to the delay lines produced by table 268 are provided to de-multiplexer 252 and to multiplexer 256. Thus, the cyclic counter and permutation table configure the de-multiplexer and multiplexer to scan the delay lines at a pseudorandom order. De-interleaver 244 comprises a permutation table 276 and a cyclic counter 280, which are similar to and synchronized with table 268 and counter 272 of the interleaver, respectively.

In alternative embodiments, any other suitable type of control circuit can be used to cause the de-multiplexer and multiplexer to scan the delay lines in a random or pseudo-random order. For example, the control circuit may compute a function that produces the appropriate indices, or use a combination of a permutation table and a function. Since the permutation table is often costly in terms of memory usage, using a function for determining the scanning order is often advantageous.

In some embodiments, a smaller permutation table can be used in conjunction with a deterministic calculation to produce the desired scanning order of the interleaver branches (delay lines). For example, the value of the cyclic counter can be split into two parts. One part, which comprises a subset of the bits of the counter value, is used to address a relatively small table that holds a random permutation. A deterministic calculation is optionally applied to the second part of the counter value. The current branch index is calculated based on the output of the permutation table and on the remaining bits of the counter value.

The combination of the small-size table and deterministic calculation can be viewed as splitting the table into multiple small-size sub-tables. For example, the table can be divided into $N_{perm}$ sub-tables, each sub-table has $N_{lin}$ entries, such that $N_{perm} \cdot N_{lin} = N_{branches}$. ($N_{branches}$ denotes the number of interleaver delay lines or branches.) The random permutation table size is thus $N_{perm}$.

In order to calculate the current delay line index based on the cyclic counter, the counter is represented as either $A \cdot N_{lin} + B$ or $B \cdot N_{perm} + A$. The current delay line index is given by index=perm(A) $N_{lin}$+B, wherein perm denotes the permutation table. For the first option of representing the cyclic counter (counter=$A \cdot N_{lin}$+B), A=FIX(counter/$N_{lin}$), B=REM(counter, $N_{lin}$) and the delay line index is given by perm(A)$N_{lin}$+B, wherein FIX denotes the integer part of the result and REM denotes the remainder. For the second option of representing the cyclic counter (counter=$B \cdot N_{perm}$+A), B=FIX(counter/$N_{perm}$), A=REM(counter, $N_{perm}$) and the delay line index is given by perm(A)$N_{lin}$+B. Thus, the lower significant part of the cyclic counter is used as the permutation table address.

In an alternative embodiment, $N_{lin}$ is restricted to powers of 2, $N_{lin}=2^{K1}$. Thus, the Kp Most Significant Bits (MSB) of the counter are used for addressing the permutation table, the output of the permutation table is right-shifted by K1 bits and added to the K1 LSB of the counter.

Further alternatively, when the counter is represented as $B \cdot N_{perm}$+A, $N_{perm}$ can be restricted to powers of 2, $N_{perm}=2^{Kp}$. The Kp LSB of the counter are used for addressing the permutation table, and the output of the permutation table is multiplied by $N_{lin}$ and added to the K1 MSB of the counter. This technique allows using the same permutation table for various interleaver sizes without a need to recalculate the permutation table each time the interleaver size is modified.

In some embodiments, the de-interleaver comprises an additional block de-interleaver following the convolutional interleaver, in order to further spread residual bursts of blocked symbols. The length of the additional block de-interleaver is typically on the order of one code word (including repetition, if one is used). The additional block de-interleaver may also assist in spreading erased intervals that are caused by the IB-bit delay line stages, whose bits are not interleaved with one another.

The different transmitter and receiver components described above, such as ECC encoders and decoders, interleavers and de-interleavers, rate adaptation modules, metric combining modules, delay modules, multiplexers and d-multiplexers may be implemented in hardware, such as in one or more Application-Specific Integrated Circuits (ASIC) or Field-Programmable Gate Arrays (FPGA). Some of these components may alternatively be implemented in software, or using a combination of hardware and software elements.

Data Partitioning with Systematic ECC

In some embodiments, the ECC used by the transmitter is systematic, i.e., a code in which the uncoded information bits remain unchanged, and the encoder introduces redundancy by adding additional coded bits. In these embodiments, the transmitter may process the uncoded bits of each code word by a processing chain that does not apply interleaving. When using this method, a receiver attempting to start receiving the channel in question will initially receive the non-interleaved and uncoded signal component with very short latency.

In some embodiments, the non-interleaved signal component comprises only the uncoded bits, and the interleaved signal component comprises only the redundancy bits. Such a configuration is particularly suitable for satellite channels that are characterized primarily by signal blockage (bit erasures) and not by random errors (noise). Alternatively, the non-interleaved signal component may also comprise some of the redundancy bits, in order to provide this component with some resilience to random bit errors.

Typically but not necessarily, the interleaved signal component is transmitted first. The non-interleaved signal component is transmitted later, so that the last bit of both components will reach the receiver approximately at the same time. The non-interleaved signal component may be transmitted in a contiguous block, or it may be spread over a certain time period to provide some protection against short erasures.

Figure 10:
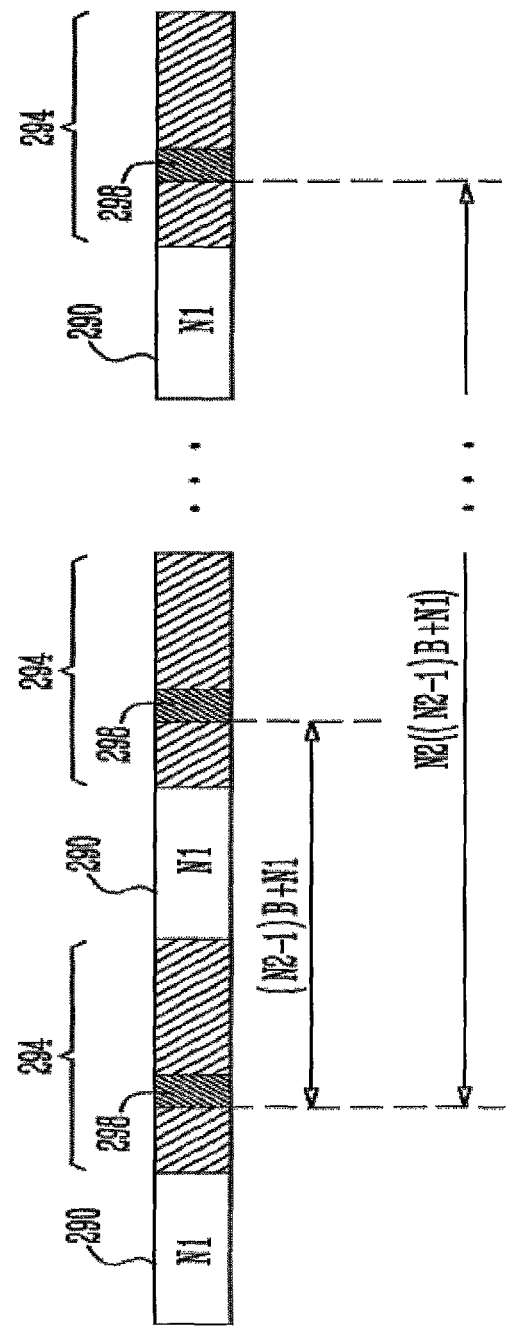
FIG. 10 is a diagram that schematically illustrates a composite signal comprising interleaved and non-interleaved components, in accordance with an embodiment of the present invention.

FIG. 10 is a diagram that schematically illustrates a composite signal comprising interleaved and non-interleaved signal components, in accordance with an embodiment of the present invention. In the present example, the ECC comprises a systematic block code, such as an LDPC code. Each code word is N bits long, of which K bits comprise the information bits and m=N−K bits comprise redundancy bits. The input data stream is thus divided into blocks of length K and provided to the ECC decoder. For each K-bit input block, the decoder produces an N-bit code word.

In the present example, N1 bits (N1<N) of each N-bit code word are processed by a processing chain that does not apply interleaving. The N1 bits are selected so that they comprise the K information bits. The remaining N2=N−N1 bit blocks are concatenated and processed by a processing chain that applies long interleaving, such as using convolutional interleaver 240 of FIG. 9 above. In the present example, the interleaver comprises I delay lines, and the delay applied by the $i^{th}$ delay line is (i−1)IB bits. The total delay contributed by this interleaver is I(I−1)IB bits. In the present example, I is chosen to be equal to N2. The transmitter multiplexer performs time-division multiplexing. The multiplexer inserts a sequence of N1 non-interleaved bits every N/R bits, wherein R denotes the transmitted bit rate.

Referring to FIG. 10, the composite signal at the output of the multiplexer comprises sequences 290 of N1 non-interleaved bits, which comprise the uncoded information bits of a certain input block of the encoder. The signal comprises sequences 294 of N2 interleaved bits. As explained above, sequences 294 comprise sequences 298 of coded bits.

Although the embodiments described herein mainly refer to transmitters and receivers having two processing chains having different interleaving characteristics, the methods and systems described herein are in no way limited to using only two processing chains. In alternative embodiments, the transmitter and receiver may use any suitable number of processing chains. For example, in SVC applications in which the video information is represented using more than two quality levels, each quality level may be processed by a corresponding processing chain in the transmitter and receiver. In some embodiments, the data of a certain video quality level can be processed by multiple chains, so that the number of processing chains may exceed the number of SVC quality levels.

In some embodiments, the transmitter and receiver may use three different processing chains having three interleaving lengths. Adding an intermediate interleaving length in addition to the short (or non-interleaved) and long interleaving channels may, for example, shorten the recovery time from a failure of the long de-interleaver. Typically, the relative delays of the three processing chains should be matched at the transmitter.

Further alternatively, any of the processing chains may comprise two or more interleavers. In other words, the same encoded data can be transmitted with different puncturing and/or repetition. Alternatively, each code word can be divided into two parts, each transmitted via a different processing chain.

Although the embodiments described herein mainly address digital video broadcast applications, the methods and systems described herein are in no way limited to video, and can be used in systems that transmit digital audio, computer data and/or any other suitable data type.

Although the embodiments described herein mainly address unidirectional broadcast applications, the methods and systems described herein can also be used in systems that transmit information bidirectional information and/or non-broadcast systems that transmit different data to different receivers.

Although the embodiments described herein mainly address configurations in which the processing chain having the longer acquisition time applies interleaving, the methods and systems described herein are not limited to such configurations. For example, one processing chain may have a longer acquisition time than another due to other reasons, such as different error correction coding schemes.

Furthermore, the methods and systems described herein are not limited to satellite applications and satellite communication channels, and can be used over various types of wireless and wireline channels. The methods and systems described herein can be used, for example, in applications that transmit packet video over communication networks.

It will thus be appreciated that the embodiments described above are cited by way of example, and that the present disclosure is not limited to what has been particularly shown and described hereinabove. Rather, the scope of the present disclosure includes both combinations and sub-combinations of the various features described hereinabove, as well as variations and modifications thereof which would occur to persons skilled in the art upon reading the foregoing description and which are not disclosed in the prior art.

What is claimed is:

1. A method comprising:
processing error correction encoded data by a first processing chain of a transmitter, the processing including interleaving a first portion of the error correction encoded data with respect to a first interleaving period to generate a first output signal, wherein the interleaving the first portion comprises de-multiplexing the first portion among multiple branches having respective delays in accordance with a distribution order and re-multiplexing delayed data from the multiple branches to form the first output signal;
processing the error correction encoded data by a second processing chain of the transmitter without use of interleaving to generate a second output signal;
multiplexing the first output signal and the second output signal into a multiplexed stream; and
transmitting the multiplexed stream from the transmitter over a communication channel to a receiver.

2. The method of claim 1, further comprising encoding input data with an error correction code encoder of the transmitter to produce the error correction encoded data.

3. The method of claim 1, wherein the processing of the error correction encoded data by the first processing chain includes modifying the first portion by repeating bits of the first portion.

4. The method of claim 1, wherein the processing of the error correction encoded data by the first processing chain includes modifying the first portion by deleting bits of the first portion.

5. The method of claim 1, wherein the processing of the error correction encoded data by the second processing chain includes delaying the second output signal prior to multiplexing the first output signal and the second output signal to match timing of the first output signal and the second output signal.

6. The method of claim 1, wherein the transmitting of the multiplexed stream includes use of a satellite to transmit the multiplexed stream to the receiver.

7. A method comprising:
receiving, at a receiver and via a communication channel, a multiplexed stream of a first signal and second data, wherein the first signal and the second data correspond to error correction code encoded data of content;

de-multiplexing the multiplexed steam to derive the first signal and the second data;

extracting first data from the first signal by de-interleaving the first signal with respect to a first de-interleaving period, wherein the de-interleaving the first signal to produce the first data comprises de-multiplexing the first signal among multiple branches having respective delays in accordance with a distribution order and re-multiplexing delayed data from the multiple branches to form the first data;

delay matching the first data and the second data;

determining first metrics from the first data and second metrics from the second data;

combining the first metrics and the second metrics to produce joint metrics; and decoding, via an error correction code decoder of the receiver using the joint metrics, the first data, the second data, or both, to produce the content.

8. The method of claim 7, further comprising de-puncturing the first data.

9. The method of claim 7, wherein the first metrics and the second metrics comprise Euclidean distance estimates, log-likelihood ratio estimates, signal-to-noise ratio estimates, mean square estimates, or combinations thereof.

10. The method of claim 7, wherein the content comprises video content.

11. The method of claim 7, wherein the joint metrics assign more weight to the second data than to the first data during initial acquisition of the multiplexed stream.

12. The method of claim 7, wherein the joint metrics assign more weight to the first data than to the second data during steady-state reception of the multiplexed stream.

13. The method of claim 7, wherein the determining the first metrics occurs prior to the de-interleaving the first signal.

14. An apparatus comprising:

a receiver configured to receive a multiplexed stream that includes a first signal and second data, the first signal and the second data corresponding to content;

a de-multiplexer configured to de-multiplex the multiplexed stream;

a first processing chain to extract first data from the first signal by de-interleaving the first signal with respect to a first de-interleaving period, wherein the de-interleaving the first signal to produce the first data comprises de-multiplexing the first signal among multiple branches having respective delays in accordance with a distribution order and re-multiplexing delayed data from the multiple branches to form the first data;

a metric combiner to produce a joint metric associated with the first data and the second data; and an error correction code decoder to decode the first data, the second data, or both, based on the joint metric to generate the content.

15. The apparatus of claim 14, further comprising a delay matcher to match timing of the first data and the second data.

16. The apparatus of claim 14, wherein the multiplexed stream is received via a satellite communication system.

17. The apparatus of claim 14, wherein the first processing chain includes a de-puncturer to replace bits deleted from the first signal prior to transmission.

18. The apparatus of claim 14, wherein more of the joint metric is due to the second data rather than to the first data during initial acquisition of the multiplexed stream.

19. The apparatus of claim 14, wherein more of the joint metric is due to the first data rather than to the second data during steady-state reception of the multiplexed stream.

20. The apparatus of claim 14, wherein the content comprises video content.

* * * * *